(12) United States Patent
Hwang

(10) Patent No.: US 12,382,787 B2
(45) Date of Patent: Aug. 5, 2025

(54) METHOD FOR MANUFACTURING A DISPLAY PANEL

(71) Applicant: Samsung Display Co., Ltd., Yongin-si (KR)

(72) Inventor: Jaekwon Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 453 days.

(21) Appl. No.: 17/984,643

(22) Filed: Nov. 10, 2022

(65) Prior Publication Data

US 2023/0292554 A1 Sep. 14, 2023

(51) Int. Cl.
*H10K 59/122* (2023.01)
*H10K 71/00* (2023.01)
*H10K 59/12* (2023.01)

(52) U.S. Cl.
CPC .......... *H10K 59/122* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 8,330,359 B2 | 12/2012 | Yoshida et al. | |
| 8,389,323 B2 | 3/2013 | Choi et al. | |
| 10,717,886 B2 * | 7/2020 | Fujii | C09D 11/52 |
| 2015/0064828 A1 * | 3/2015 | Watanabe | C09K 11/06 |
| | | | 438/46 |
| 2023/0345768 A1 * | 10/2023 | Hwang | H10K 59/122 |
| 2024/0107846 A1 * | 3/2024 | Yoon | H10K 59/871 |

FOREIGN PATENT DOCUMENTS

| | | |
|---|---|---|
| JP | 2009129606 A | 6/2009 |
| KR | 1020080010425 A | 1/2008 |
| KR | 1020100124204 A | 11/2010 |
| KR | 1020170110722 A | 3/2019 |

* cited by examiner

*Primary Examiner* — Michelle Mandala
(74) *Attorney, Agent, or Firm* — CANTOR COLBURN LLP

(57) ABSTRACT

A method of manufacturing a display panel includes forming a pixel defining layer defining an opening exposing an upper surface of a pixel electrode on a substrate on which the pixel electrode is formed, providing an auxiliary solvent into the opening, performing a liquid-repellent treatment on an upper surface of the pixel defining layer, removing the auxiliary solvent from the opening and providing an organic composition including an organic solvent into the opening.

20 Claims, 15 Drawing Sheets

METHOD FOR MANUFACTURING A DISPLAY PANEL

This application claims priority to Korean Patent Application No. 10-2022-0030080, filed on Mar. 10, 2022, and all the benefits accruing therefrom under 35 U.S.C. § 119, the content of which in its entirety is herein incorporated by reference.

BACKGROUND

1. Field

Embodiments of the invention relate to a method for manufacturing a display panel.

2. Description of the Related Art

An organic light emitting display panel includes sub-pixels that emit red, green, and blue visible light. An organic layer is formed in each of the sub-pixels. The organic layer may be formed using an inkjet printing method.

SUMMARY

Embodiments provide a method of manufacturing a display panel capable of improving an yield of the display panel.

A method of manufacturing a display panel according to an embodiment includes: forming a pixel defining layer defining an opening exposing an upper surface of a pixel electrode on a substrate on which the pixel electrode is formed, providing an auxiliary solvent into the opening, performing a liquid-repellent treatment on an upper surface of the pixel defining layer, removing the auxiliary solvent from the opening and providing an organic composition including an organic solvent into the opening.

In an embodiment, the auxiliary solvent may be the same as the organic solvent.

In an embodiment, the auxiliary solvent may be discharged into the opening to cover the upper surface of the pixel electrode when providing the auxiliary solvent into the opening.

In an embodiment, the upper surface of the pixel defining layer may be exposed from the auxiliary solvent after providing the auxiliary solvent into the opening.

In an embodiment, a side surface of the pixel defining layer may be covered by the auxiliary solvent after providing the auxiliary solvent into the opening.

In an embodiment, the upper surface of the pixel defining layer may have liquid repellency with respect to the organic composition after performing the liquid-repellent treatment.

In an embodiment, the upper surface of the pixel electrode may have lyophilicity with respect to the organic composition after performing the liquid-repellent treatment.

In an embodiment, a first contact angle between the organic composition and the upper surface of the pixel defining layer may be about 55 degrees)(° or more, and a second contact angle between the organic composition and the upper surface of the pixel electrode may be about 5° or less after performing the liquid-repellent treatment.

In an embodiment, a fluorine group may be introduced on one surface of the pixel defining layer when performing the liquid-repellent treatment.

In an embodiment, a reactive gas containing a fluorine compound may be used when performing the liquid-repellent treatment.

In an embodiment, the fluorine compound may include at least one selected from the group consisting of $CF_4$, $SiF_4$, $C_3F_8$, $C_2F_6$, $CHF_3$, $CCIF_3$, $NF_3$, and $SF_6$.

In an embodiment, removing of the auxiliary solvent from the opening includes drying and heat-treating the auxiliary solvent.

In an embodiment, the method may further include drying and heat-treating the organic composition to form an organic layer after providing the organic composition into the opening.

In an embodiment, the organic layer may be in contact with a side surface of the pixel defining layer and the upper surface of the pixel electrode.

In an embodiment, drying and heat-treating the auxiliary solvent and drying and heat-treating the organic composition to form the organic layer may be performed at a pressure of about 10-5 Torr to about 1 Torr and at a temperature of about 25 degrees in Celsius (° C.) to about 150° C.

In an embodiment, the auxiliary solvent may be provided into the opening using an inkjet printing method.

In an embodiment, the organic composition may include at least one selected from the group consisting of a hole transport material, an organic light emitting material, a quantum dot material, and an electron transport material.

In an embodiment, forming the pixel defining layer may include forming a preliminary pixel defining layer on the substrate and forming the opening exposing the pixel electrode in the preliminary pixel defining layer.

In an embodiment, the preliminary pixel defining layer may have lyophilicity with respect to the organic composition.

In an embodiment, the method may further include performing plasma-treatment to the pixel defining layer after forming the opening.

Therefore, the method of manufacturing the display panel according to embodiments may include providing the auxiliary solvent into the opening of the pixel defining layer before the liquid-repellent treatment of the pixel defining layer. Accordingly, the liquid repellency with respect to the organic composition may be imparted to the upper surface of the pixel defining layer exposed from the auxiliary solvent, without imparting the liquid repellency with respect to the organic composition to the upper surface of the pixel electrode covered by the auxiliary solvent.

Therefore, in the process of providing the organic composition into the opening using the inkjet printing method, it is possible to minimize or prevent the overflow of the organic composition to the upper surface of the pixel defining layer. In addition, it is possible to minimize or prevent an occurrence of a space in the opening in which the organic composition is not filled. Accordingly, the yield of the display panel may be effectively improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Illustrative, non-limiting embodiments will be more clearly understood from the following detailed description in conjunction with the accompanying drawings.

Figure 1:
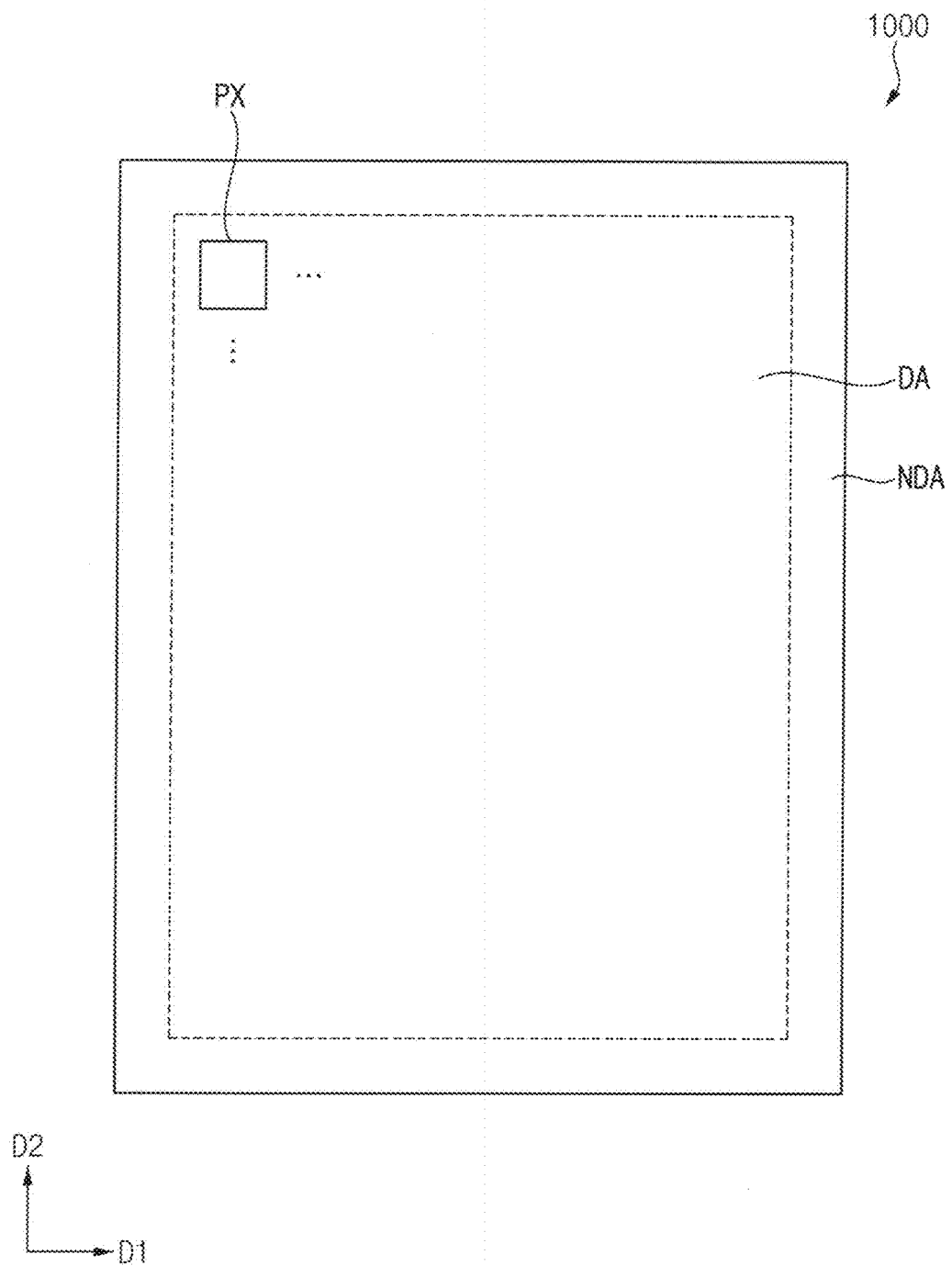
FIG. 1 is a plan view illustrating a display panel according to an embodiment.
Figure 2:
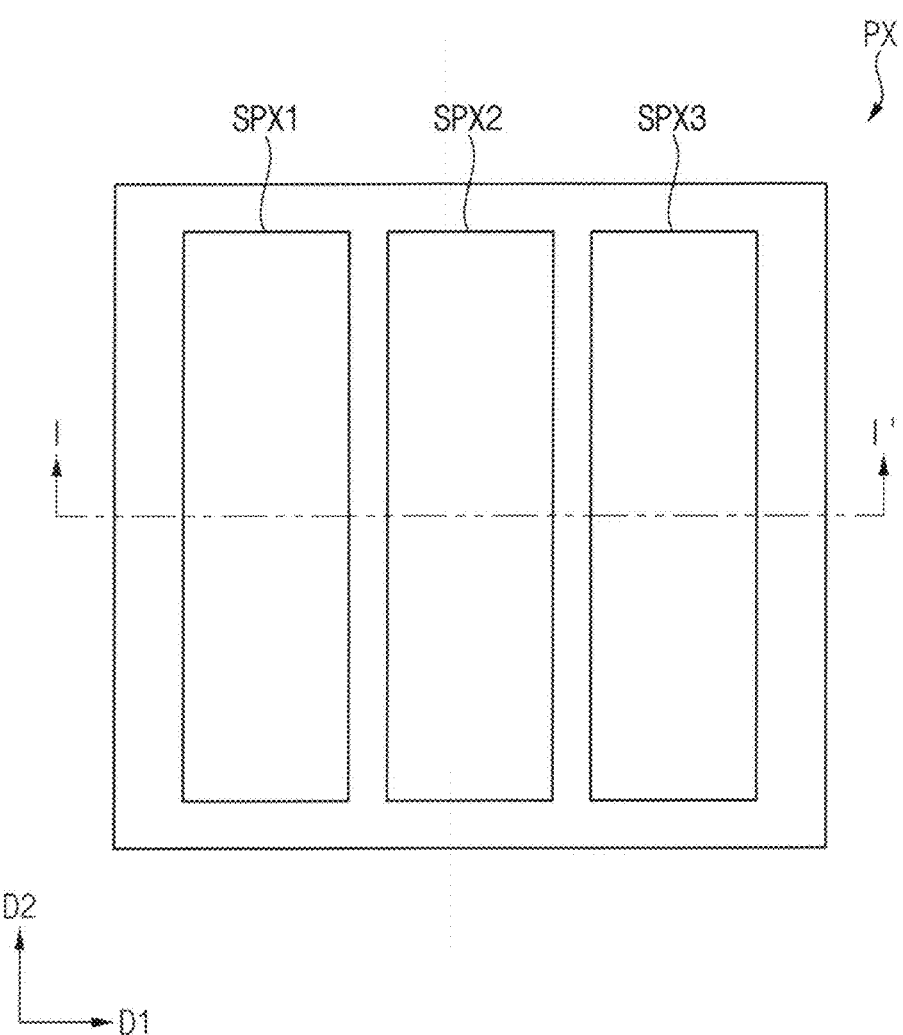
FIG. 2 is a plan view illustrating a pixel included in the display panel of FIG. 1.

FIG. 1 is a plan view illustrating a display panel according to an embodiment. FIG. 2 is a plan view illustrating a pixel included in the display panel of FIG. 1.

Referring to FIGS. 1 and 2, a display panel 1000 according to an embodiment may include a display area DA and a non-display area NDA. An image may be displayed in the display area DA. The non-display area NDA may be located around the display area DA.

The display panel 1000 may include a plurality of pixels PX disposed in the display area DA. For example, the pixels PX may be arranged in a matrix form along a first direction and a second direction perpendicular to the first direction.

Each of the pixels PX may include a plurality of sub-pixels emitting light of different colors. In an embodiment, each of the pixels PX may include first to third sub-pixels SPX1, SPX2, and SPX3 emitting light of different colors. For example, the first sub-pixel SPX1 may emit red light, the second sub-pixel SPX2 may emit green light, and the third sub-pixel SPX3 may emit blue light, but embodiments are not limited thereto.

Each of the first to third sub-pixels SPX1, SPX2, and SPX3 may include a thin film transistor and a light emitting element. The thin film transistor may generate a driving current and provide the generated driving current to the light emitting element. The light emitting element may emit light based on the driving current. For example, the light emitting element may include (or may be) an organic light emitting diode, an inorganic light emitting diode, a quantum dot light emitting diode, or the like.

Figure 3:
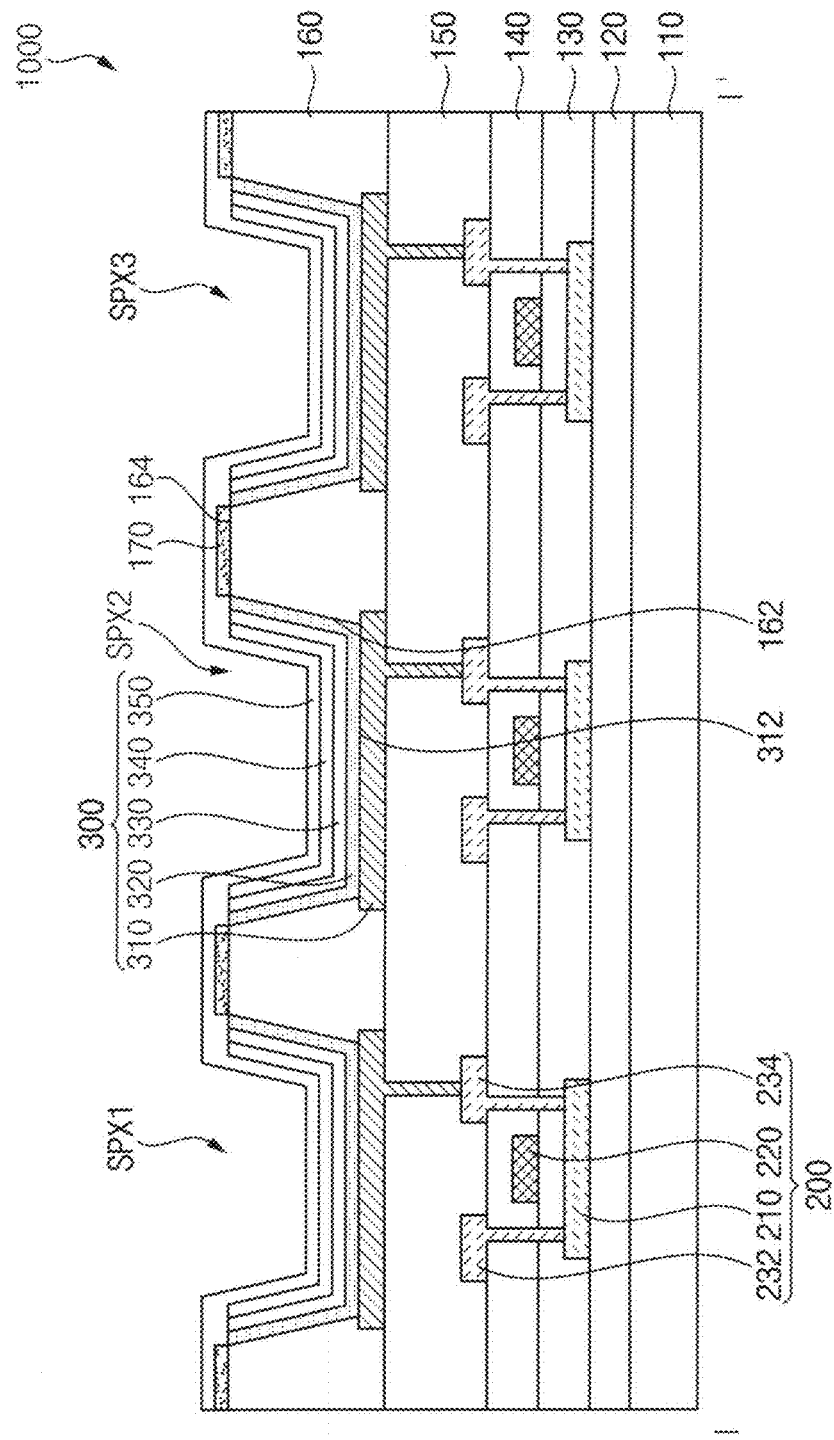
FIG. 3 is a cross-sectional view taken along line I-I' of FIG. 2.

FIG. 3 is a cross-sectional view taken along line I-I' of FIG. 2.

Referring to FIGS. 2 and 3, in an embodiment, the display panel 1000 may include a substrate 110, the first sub-pixel SPX1, the second sub-pixel SPX2, the third sub-pixel SPX3. Each of the first to third sub-pixels SPX1, SPX2, and SPX3 may include the thin film transistor 200 and the light emitting element 300. The thin film transistor 200 may include an active layer 210, a gate electrode 220, a source electrode 232, and a drain electrode 234. The light emitting element 300 may include a first electrode 310 (in other word, "pixel electrode"), a first organic layer 320, a light emitting layer 330, a second organic layer 340, and a second electrode 350 (in other word, "opposite electrode").

The substrate 110 may be an insulating substrate formed of a transparent or opaque material. In an embodiment, the substrate 110 may include a glass. In this case, the display panel 1000 may be a rigid display panel. In another embodiment, the substrate 110 may include a plastic. In this case, the display panel 1000 may be a flexible display panel.

The active layer 210 may be disposed on the substrate 110. The active layer 210 may include an oxide semiconductor, a silicon semiconductor, an organic semiconductor, or the like. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or the like. The active layer 210 may include a source area, a drain area, and a channel area positioned between the source area and the drain area.

In an embodiment, a buffer layer 120 may be disposed between the substrate 110 and the active layer 210. The buffer layer 120 may prevent impurities such as oxygen or moisture from diffusing into the active layer 210 from the substrate 110. The buffer layer 120 may include an inorganic insulating material such as a silicon compound, a metal oxide, or the like. Examples of the inorganic insulating material that can be used for the buffer layer 120 may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like. These can be used alone or in a combination thereof. The buffer layer 120 may have a single-layered structure or a multi-layered structure including a plurality of insulating layers.

A first insulating layer 130 may be disposed on the active layer 210. The first insulating layer 130 may cover the active layer 210 on the substrate 110. The first insulating layer 130 may include an inorganic insulating material.

The gate electrode 220 may be disposed on the first insulating layer 130. The gate electrode 220 may overlap the channel area of the active layer 210. The gate electrode 220 may include a conductive material such as a metal, an alloy, a conductive metal nitride, a conductive metal oxide, a transparent conductive material, or the like. Examples of the conductive material that can be used for the gate electrode 220 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, alloys containing silver, alloys containing copper, alloys containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide ("ITO"), tin oxide (SnO), indium oxide (InO), gallium oxide (GaO), indium zinc oxide ("IZO"), or the like. These can be used alone or in a combination thereof. The gate electrode 220 may have a single-layered structure or a multi-layered structure including a plurality of conductive layers.

A second insulating layer 140 may be disposed on the gate electrode 220. The second insulating layer 140 may cover the gate electrode 220 on the first insulating layer 130. The second insulating layer 140 may include an inorganic insulating material.

The source electrode 232 and the drain electrode 234 may be disposed on the second insulating layer 140. The source electrode 232 and the drain electrode 234 may be connected to the source area and the drain area of the active layer 210, respectively. Each of the source electrode 232 and the drain electrode 234 may include a conductive material.

A third insulating layer 150 may be disposed on the source electrode 232 and the drain electrode 234. The third insulating layer 150 may include an organic insulating material. Examples of the organic insulating material that can be used for the third insulating layer 150 may include a photoresist, a polyacryl-based resin, a polyimide-based resin, a polyamide-based resin, a siloxane-based resin, an acryl-based resin, an epoxy-based resin, or the like. These can be used alone or in a combination thereof. In an embodiment, the third insulating layer 150 may have a single-layered structure or a multi-layered structure including a plurality of insulating layers.

The first electrode 310 may be disposed on the third insulating layer 150. The first electrode 310 may be connected to the drain electrode 234 through a contact hole formed in the third insulating layer 150. Accordingly, the first electrode 310 may be electrically connected to the thin film transistor 200.

The first electrode 310 may include a conductive material. In an embodiment, the first electrode 310 may have a multi-layered structure including a plurality of conductive layers. For example, the first electrode 310 may have a multi-layered structure of Ag/ITO, ITO/Ag/ITO, Mo/ITO, or Al/ITO, but embodiments are not limited thereto.

The pixel defining layer 160 may be disposed on the first electrode 310. The pixel defining layer 160 may define an opening OP. The opening OP may expose a central portion of the first electrode 310. That is, the pixel defining layer 160 may cover a peripheral portion of the first electrode 310. Specifically, the opening OP may be defined from the side surface 162 of the pixel defining layer 160 exposed through the pixel defining layer 160. For example, the side surface 162 of the pixel defining layer 160 may be inclined in a direction toward the upper surface 164 of the pixel defining layer 160 on the first electrode 310. Accordingly, the cross-sectional shape of the opening OP may have a trapezoidal shape. However, the present invention is not necessarily limited thereto, and the side surface 162 of the pixel defining layer 160 may be perpendicular to the first electrode 310 and the upper surface of the pixel defining layer 160. In this case, a shape of the opening ("OP") may have a rectangular shape.

A liquid repellent layer 170 may be disposed on the upper surface 164 of the pixel defining layer 160. Accordingly, the upper surface 164 of the pixel defining layer 160 may have a liquid repellency.

The liquid repellency may mean a property that repels a predetermined solution and that the solution does not permeate well. In addition, lyophilicity may mean a property of excellent affinity for the solution. For example, the solution may have a relatively low surface bonding force with one surface having liquid repellency, and the solution disposed on one surface having the liquid repellency may have an increased surface tension. In addition, the solution may have a relatively high surface binding force with the lyophilic one surface, and the solution disposed on one surface having the lyophilic may have a reduced surface tension.

When the one surface on which the solution is disposed has lyophilicity, the solution may have a larger contact angle than when the one surface on which the solution is disposed has lyophilicity. In this case, the contact angle may mean an angle between the tangent line of a surface of the solution and the one surface at a point where the solution is in contact with the one surface on which the solution is disposed. As the liquid repellency increases, the contact angle may increase.

In an embodiment, the liquid repellent layer 170 may be adsorbed on the upper surface 164 of the pixel defining layer 160. For example, the liquid repellent layer 170 may include fluorine ions, and the fluorine ions may be adsorbed on the upper surface 164 of the pixel defining layer 160. That is, the liquid repellent layer 170 may be formed by introducing a fluorine group on one surface of the pixel defining layer 160. This will be described later in more detail with reference to FIG. 9.

The first organic layer 320 may be disposed on the first electrode 310. The first organic layer 320 may be disposed in the opening OP of the pixel defining layer 160. That is, the first organic layer 320 may overlap the first electrode 310. For example, the first organic layer may be formed using an inkjet printing method. This will be described later in more detail with reference to FIGS. 12 to 15.

The first organic layer 320 may include at least one of a hole injection layer ("HIL"), and a hole transport layer ("HTL"). The hole injection layer and the hole transport layer may allow holes injected from the first electrode 310 to be easily transported. The hole injection layer may include CuPc or starburst-type amines such as TCTA, m-MTDATA, IDE406, and the like. The hole transport layer may include TPD or α-TPD.

The light emitting layer 330 may be disposed on the first organic layer 320. That is, the light emitting layer 330 may be disposed in the opening OP of the pixel defining layer 160. The light emitting layer 330 may overlap the first electrode 310. The light emitting layer 330 may include at least one of an organic light emitting material and quantum dots. In an embodiment, the light emitting layer 330 may be formed using an inkjet printing method. However, the present invention is not limited thereto, and the light emitting layer 330 may be formed using an anisotropic deposition method such as a vacuum deposition method in another embodiment. In this case, the light emitting layer 330 may be entirely disposed in the upper surface 164 of the pixel defining layer 160 and the opening OP of the pixel defining layer 160. This will be described later in more detail with reference to FIGS. 12 to 15.

In an embodiment, the organic light emitting material may include a low molecular weight organic compound or a high molecular weight organic compound. Examples of the low molecular weight organic compound may include copper phthalocyanine, N,N-diphenylbenzidine, tris-(8-hydroxy-quinoline)aluminum, and the like. Examples of the polymer organic compound may include polyethylenedioxythio-phene (poly(3,4-ethylenedioxythiophene), polyaniline, poly-phenylenevinylene, polyfluorene, etc.). These may be used alone or in combination with each other.

In an embodiment, the quantum dot may include a core including a group II-VI compound, a group III-V compound, a group IV-VI compound, a group IV element, a group IV compound, and combinations thereof. In one embodiment, the quantum dot may have a core-shell structure including the core and a shell surrounding the core. The shell may serve as a protective layer for maintaining semiconductor properties by preventing chemical modification of the core and as a charging layer for imparting electrophoretic properties to the quantum dots.

The second organic layer 340 may be disposed on the light emitting layer 330. That is, the second organic layer 340 may be disposed in the opening OP of the pixel defining layer 160. The second organic layer 340 may overlap the first electrode 310. In an embodiment, the second organic layer 340 may be formed using an inkjet printing method. However, the present invention is not limited thereto, and the second organic layer 340 may be formed using an anisotropic deposition method such as a vacuum deposition method in another embodiment. In this case, the second organic layer 340 may be entirely disposed in the upper surface 164 of the pixel defining layer 160 and the opening OP of the pixel defining layer 160. This will be described later in more detail with reference to FIGS. 12 to 15.

The second organic layer 340 may include at least one of an electron transporting layer ("ETL") and an electron injection layer ("EIL"). The electron injection layer and the electron transport layer may allow electrons injected from the second electrode 350 to be easily transported. The electron transport layer may include Alq3, PBD, TNF, BMD, BND, or the like. The electron injection layer may include LiF, LiQ, NaCl, CsF, Li2O, BaO, and the like. In an embodiment, the second organic layer 340 may be omitted.

The second electrode 350 may be disposed on the second organic layer 340. In an embodiment, the second electrode 350 may be entirely disposed in the upper surface 164 of the pixel defining layer 160 and the opening OP of the pixel defining layer 160. A portion of the second electrode 350 disposed in the opening OP may overlap the first electrode 310. The second electrode 350 may include a conductive material such as a metal, an alloy, a conductive metal nitride, a conductive metal oxide, or a transparent conductive material. The second electrode 350 may have a single-layer structure or a multi-layer structure including a plurality of conductive layers.

FIGS. 4 to 15 are cross-sectional views illustrating a method of manufacturing the display panel of FIG. 3.

Figure 4:
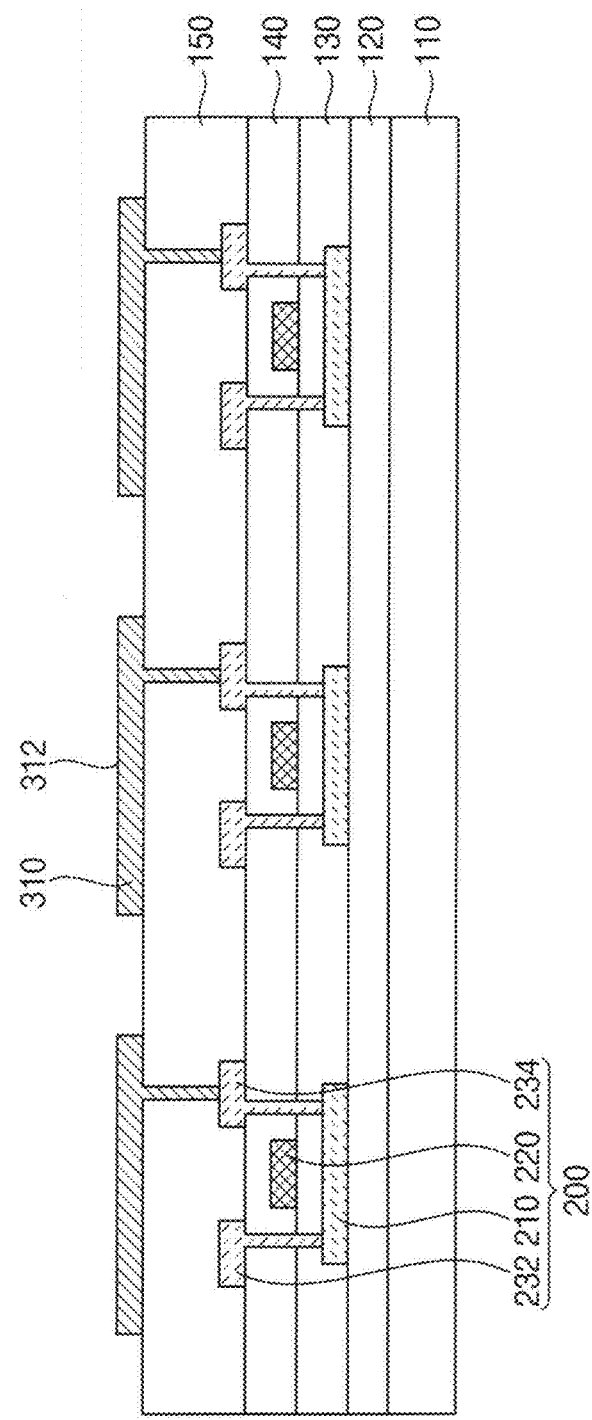
FIGS. 4 to 15 are cross-sectional views illustrating a method of manufacturing the display panel of FIG. 3.

Referring to FIG. 4, the thin film transistor 200 may be formed on the substrate 110.

First, the buffer layer 120 may be formed on the substrate 110. Thereafter, the active layer 210 may be formed on the buffer layer 120. The active layer 210 may be formed using an oxide semiconductor, a silicon semiconductor, an organic semiconductor, or the like.

The first insulating layer 130 may be formed on the buffer layer 120. The first insulating layer 130 may cover the active layer 210 disposed on the buffer layer 120. The first insulating layer 130 may be formed using an inorganic insulating material.

The gate electrode 220 may be formed on the first insulating layer 130. The gate electrode 220 may be formed using a conductive material.

The second insulating layer 140 may be formed on the first insulating layer 130. The second insulating layer 140 may cover the gate electrode 220 on the first insulating layer 130. The second insulating layer 140 may be formed using an inorganic insulating material.

Contact holes may be formed in the first insulating layer 130 and the second insulating layer 140 to overlap each of the source region and the drain region of the active layer 210. In addition, the source electrode 232 and the drain electrode 234 may be formed on the second insulating layer 140 to overlap each of the contact holes. Each of the source electrode 232 and the drain electrode 234 may be formed using a conductive material. The source electrode and the drain electrode 234 may be respectively connected to the source region and the drain region of the active layer 210 through the contact holes. Accordingly, the thin film transistor 200 including the active layer 210, the gate electrode 220, the source electrode 232, and the drain electrode 234 may be formed on the substrate 110.

The third insulating layer 150 covering the thin film transistor 200 may be formed on the second insulating layer 140. The third insulating layer 150 may cover the source electrode 232 and the drain electrode 234 on the second insulating layer 140. The third insulating layer 150 may be formed using an organic insulating material.

Contact holes may be formed in the third insulating layer 150 to overlap the drain electrode 234. Also, the first electrode 310 may be formed on the third insulating layer 150 to overlap each of the contact holes. The first electrode 310 may be formed using a conductive material.

Figure 5:
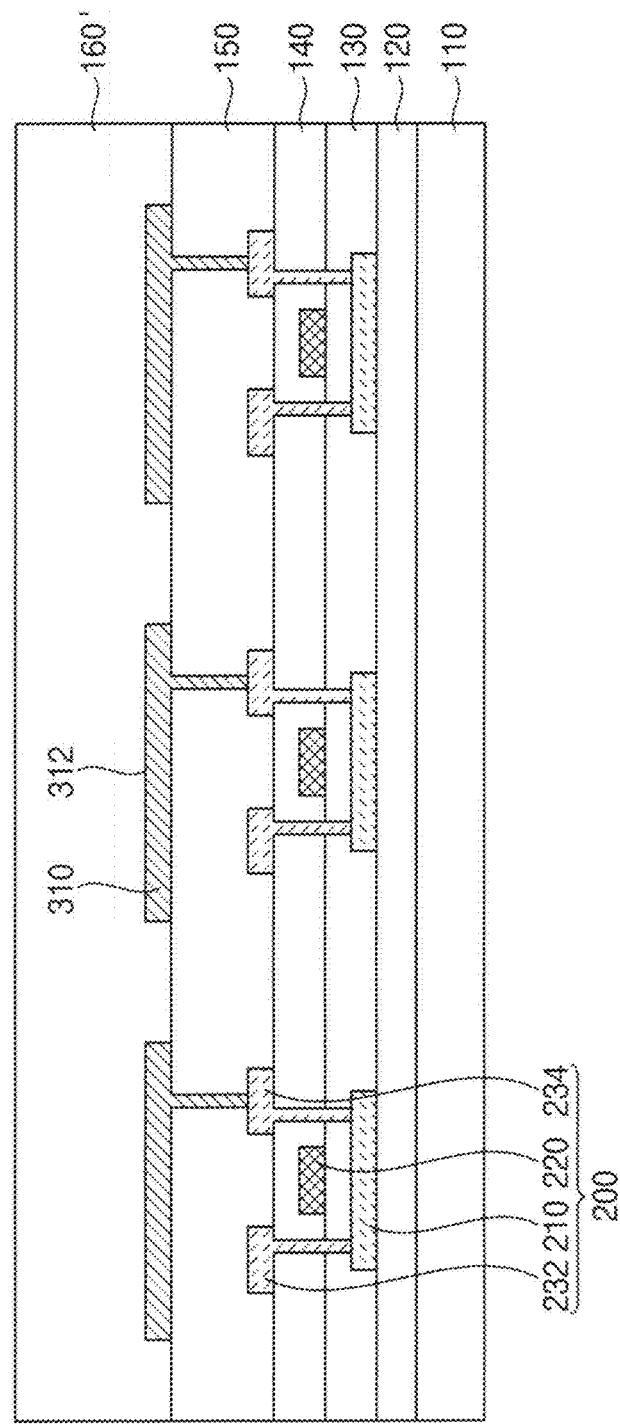

Referring to FIG. 5, a preliminary pixel defining layer 160' may be formed on the third insulating layer 150. In an embodiment, the preliminary pixel defining layer 160' may have lyophilicity with respect to a predetermined organic composition. In other words, the preliminary pixel defining layer 160' may not have a liquid repellency with respect to the organic composition. In this case, the predetermined organic composition may be an organic composition to be described later.

Figure 6:
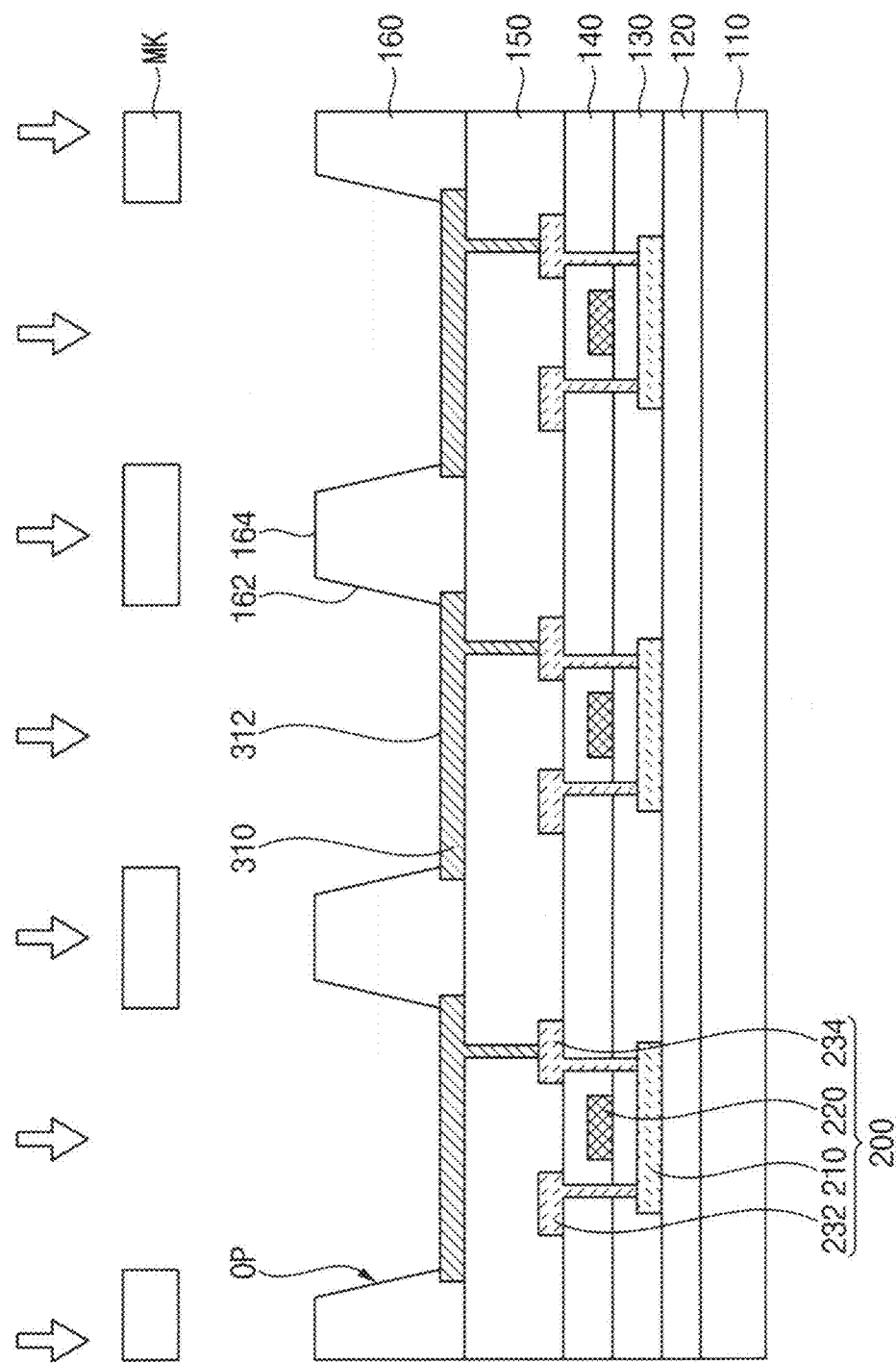

Referring to FIG. 6, the pixel defining layer 160 may be formed on the third insulating layer 150. The pixel defining layer 160 may be formed by forming the opening OP in the preliminary pixel defining layer 160'. The opening OP may be formed by performing a photolithography process on the preliminary pixel defining layer 160'. That is, the opening OP may be formed through the preliminary pixel defining layer 160' to expose the central portion of the first electrode 310. Accordingly, a portion of the upper surface 312 of the first electrode 310 may be exposed to the outside. The photolithography process for forming the opening OP may be performed using an exposure mask MK.

In an embodiment, when the pixel defining layer 160 is formed through the photolithography process, an unremoved residue among the materials constituting the preliminary pixel defining layer 160' may remain on the first electrode 310. Since the residue deteriorates the reliability of the display panel 1000, removal may be required.

Figure 7:
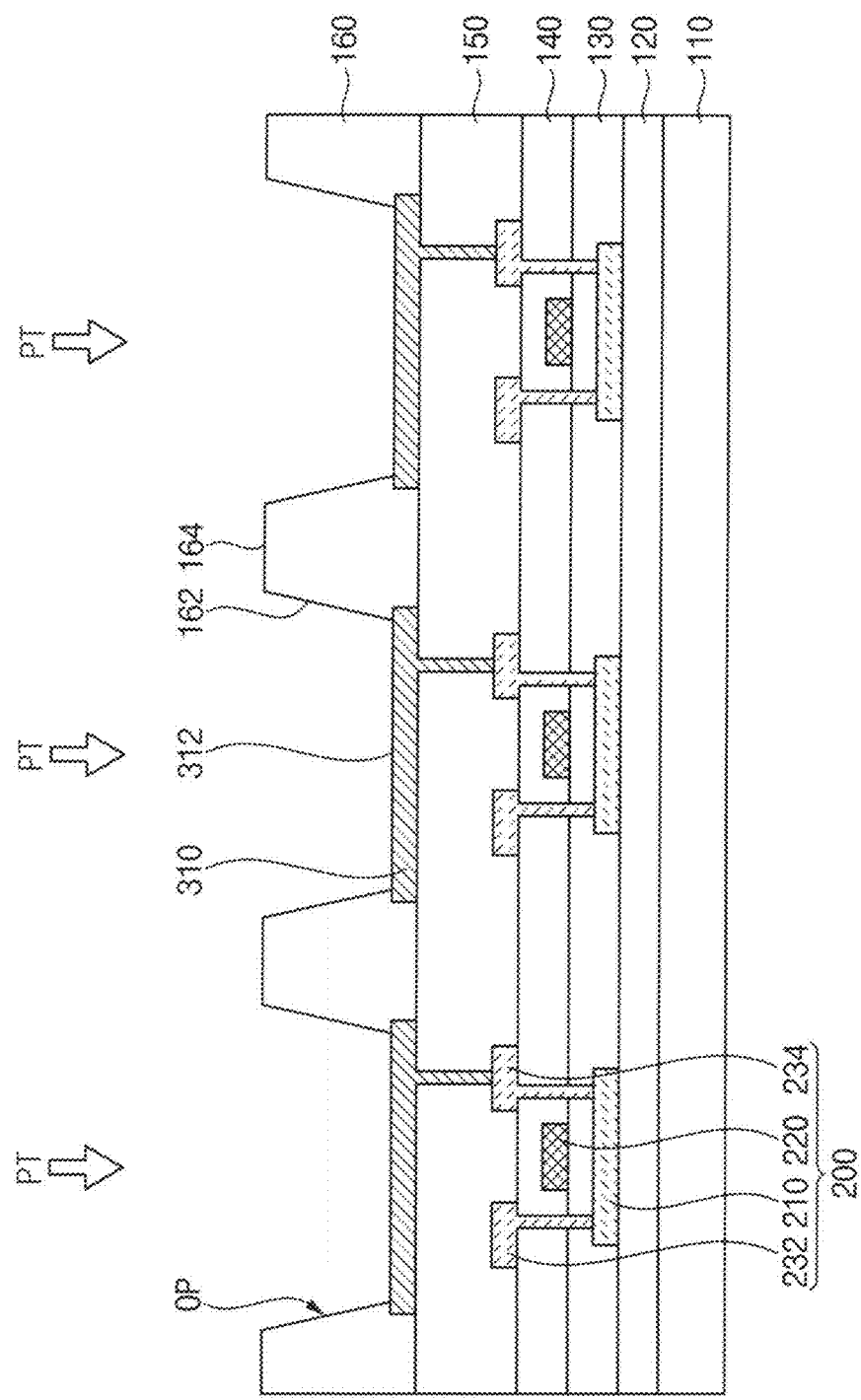

Referring to FIG. 7, in an embodiment, a plasma-treatment PT may be performed to remove the residue. The plasma-treatment PT may be performed on the pixel defining layer 160. The residue remaining on the upper surface 312 of the first electrode 310 may be removed through the plasma-treatment PT. Accordingly, the yield of the display panel may be further improved.

Figure 8:
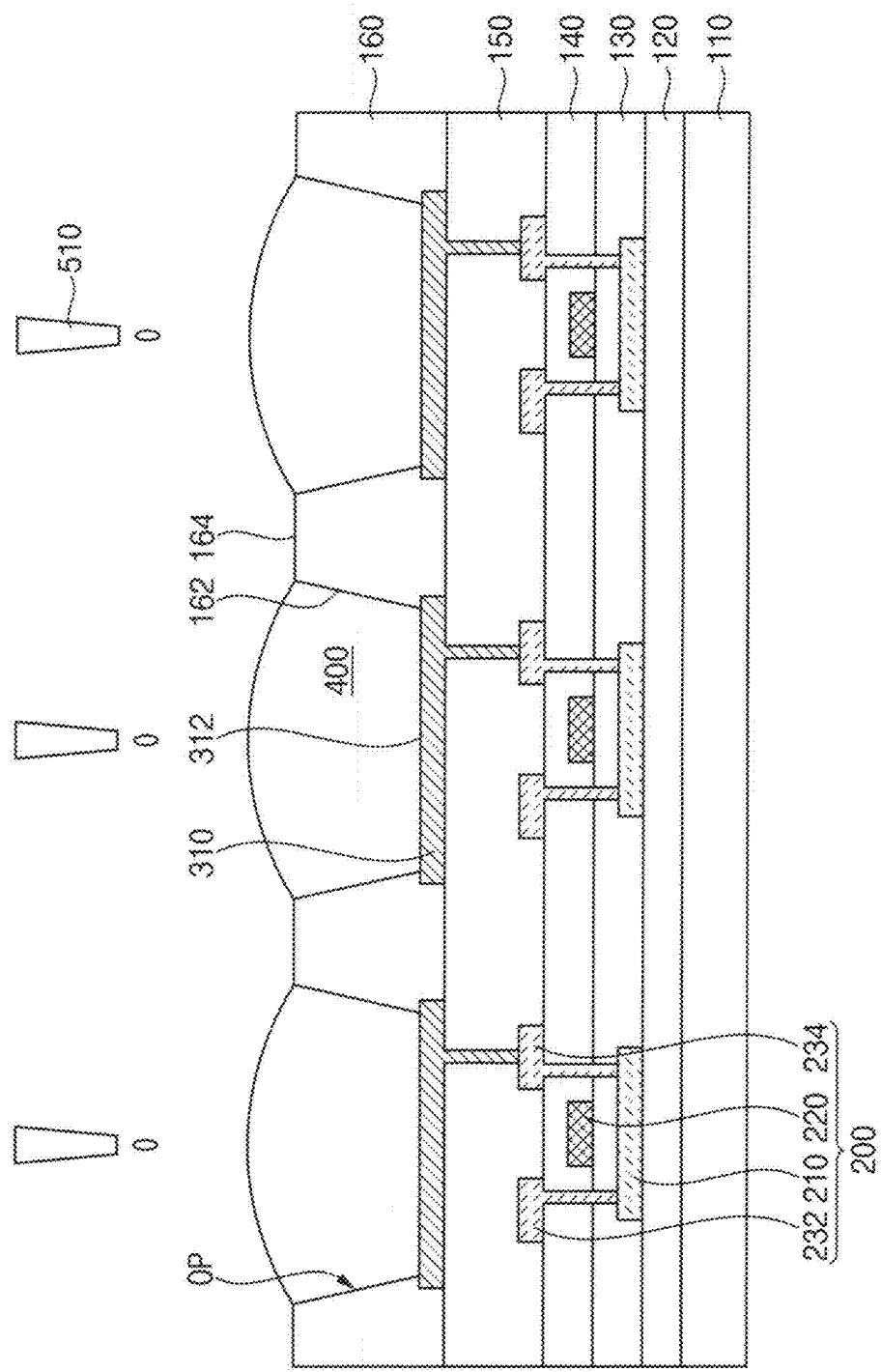

Referring to FIG. 8, the auxiliary solvent 400 may be provided into the opening OP of the pixel defining layer 160. In an embodiment, the auxiliary solvent 400 may be provided using an inkjet printing method. For example, the auxiliary solvent 400 may be provided by discharging the auxiliary solvent 400 into the opening OP through the first nozzle 510 of an inkjet printing apparatus. For example, the auxiliary solvent 400 may be discharged into the opening OP so that the upper surface 164 of the pixel defining layer 160 is exposed and the upper surface 312 of the first electrode 310 is covered. In other words, by discharging the auxiliary solvent 400 into the opening OP of the pixel defining layer 160, the auxiliary solvent may expose the upper surface 164 of the pixel defining layer 160 and may not expose the upper surface 312 of the first electrode 310. Accordingly, in the liquid-repellent treatment process to be described later, the upper surface 164 of the pixel defining layer 160 may be exposed to a reactive gas for the liquid-repellent treatment, while the upper surface 312 of the first electrode 310 may not be exposed to the reactive gas. In an embodiment, the auxiliary solvent 400 may be discharged into the opening OP to cover both the side surface 162 of the pixel defining layer 160 and the upper surface 312 of the first electrode 310. In this case, in the liquid-repellent treatment process, both the side surface 162 of the pixel defining layer 160 and the upper surface 312 of the first electrode 310 may not be exposed to the reactive gas.

In an embodiment, the auxiliary solvent 400 may use a solvent that does not volatilize at room temperature. Accordingly, in the liquid-repellent treatment process, it is possible to minimize or prevent a phenomenon in which the path of the reaction gas is obstructed by the auxiliary solvent 400 volatilized. Accordingly, after the liquid repellency treatment process, the liquid repellency of the upper surface 164 of the pixel defining layer 160 may be further improved.

In an embodiment, the auxiliary solvent 400 may use a solvent substantially the same as or similar to the organic solvent included in the organic composition to be described later. The organic composition may be a material for forming the first organic layer 320, the light emitting layer 330, or the second organic layer 340 described with reference to FIG. 3. Since the organic composition must be provided into the opening OP to form the first organic layer 320, the light emitting layer 330, or the second organic layer 340, before the process of providing the organic composition, the process of removing the auxiliary solvent 400 may be required. In this case, when the solvent substantially identical to or similar to the organic solvent is used as the auxiliary solvent 400, in the process of removing the auxiliary solvent 400, even if a part of the auxiliary solvent 400 remains in the opening OP, it is possible to minimize or prevent deterioration of physical properties of the first organic layer 320, the light emitting layer 330, or the second organic layer 340 formed from the organic composition. Accordingly, the yield of the display panel 1000 may be further improved.

Figure 9:
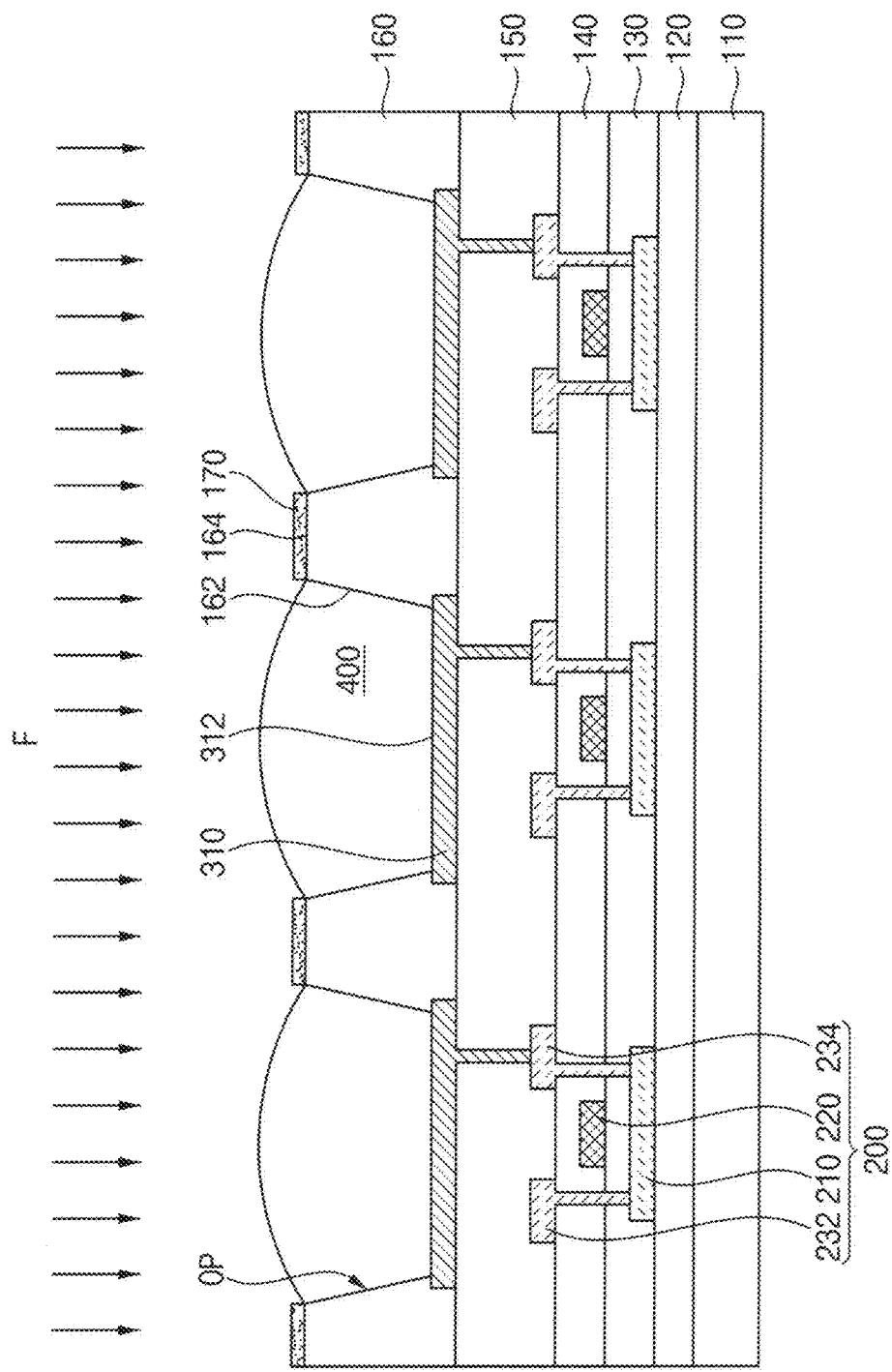

Referring to FIG. 9, the liquid-repellent treatment may be performed on the pixel defining layer 160. The lyophobic treatment may be performed to impart lyophobicity to the pixel defining layer 160 having lyophilicity with respect to the organic composition. The liquid-repellent treatment may be performed after the auxiliary solvent 400 is provided into the opening OP.

In an embodiment, the liquid repellency treatment may be performed by introducing a fluorine group on one surface of the pixel defining layer 160. For example, the liquid-repellent treatment may be performed by exposing the pixel defining layer 160 to the reactive gas including a fluorine compound. Specifically, fluorine (F) contained in the fluorine compound may be decomposed to generate fluorine ions, and the generated fluorine ions may be adsorbed to form the liquid repellent layer 170. Examples of the fluorine compound may include CF4, SiF4, C3F8, C2F6, CHF3, CClF3, NF3, and SF6. These may be used alone or in combination with each other.

According to embodiments, since the liquid-repellent treatment is performed after the auxiliary solvent 400 is provided into the opening OP, a region covered by the auxiliary solvent 400 among the upper surface 164 of the pixel defining layer 160, the side surface 162 of the pixel defining layer 160, and the upper surface 312 of the first electrode 310 may not be exposed to the reactive gas. In other words, only a specific region exposed from the auxiliary solvent 400 among the upper surface 164 of the pixel defining layer 160, the side surface 162 of the pixel defining layer 160, and the upper surface 312 of the first electrode 310 may be selectively exposed to the reactive gas. For example, in the case that the auxiliary solvent 400 is provided into the opening OP to cover the side surface 162 of the pixel defining layer 160 and the upper surface 312 of the first electrode 310, and expose the upper surface 164 of the pixel defining layer 160, the upper surface 164 of the pixel defining layer 160 may be exposed to the reactive gas in the liquid-repellent treatment process, and the side surface 162 of the pixel defining layer 160 and the upper surface 312 of the first electrode 310 may not be exposed to the reactive gas. Accordingly, the liquid repellent layer 170 may be formed on the upper surface 164 of the pixel defining layer 160. On the other hand, since the fluorine ions are not adsorbed by the auxiliary solvent 400 disposed on the side surface 162 of the pixel defining layer 160 and the upper surface 312 of the first electrode 310, the liquid repellent layer 170 may not be formed on the side surface 162 of the pixel defining layer 160 and the upper surface 312 of the first electrode 310. Accordingly, the upper surface 164 of the pixel defining layer 160 may have liquid repellency with respect to the organic composition. On the other hand, the side surface 162 of the pixel defining layer 160 and the upper surface 312 of the first electrode 310 may keep lyophilicity with respect to the organic composition. In other words, the side surface 162 of the pixel defining layer 160 and the upper surface 312 of the first electrode 310 may not have liquid repellency with respect to the organic composition.

Figure 10:
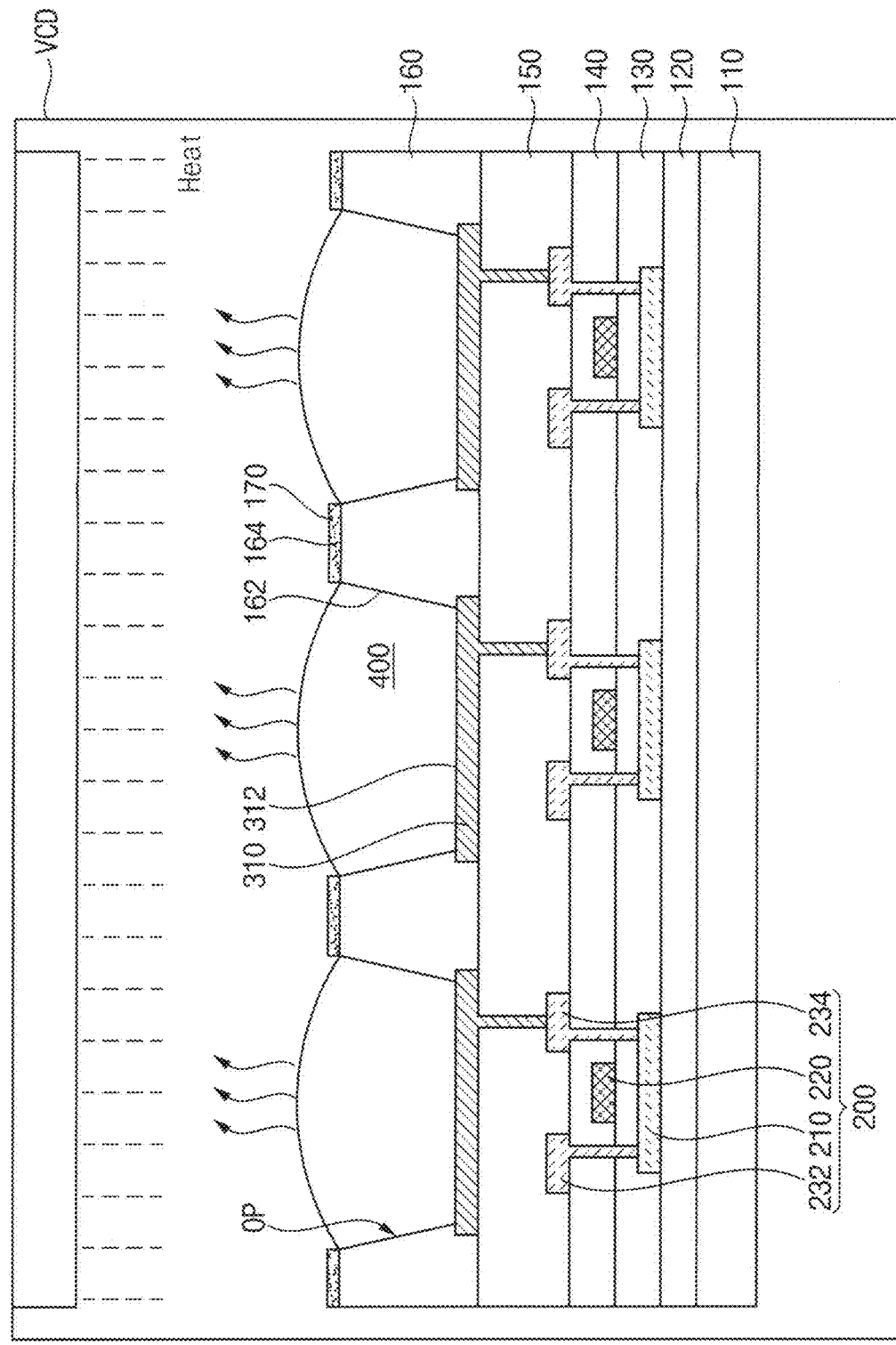
Figure 11:
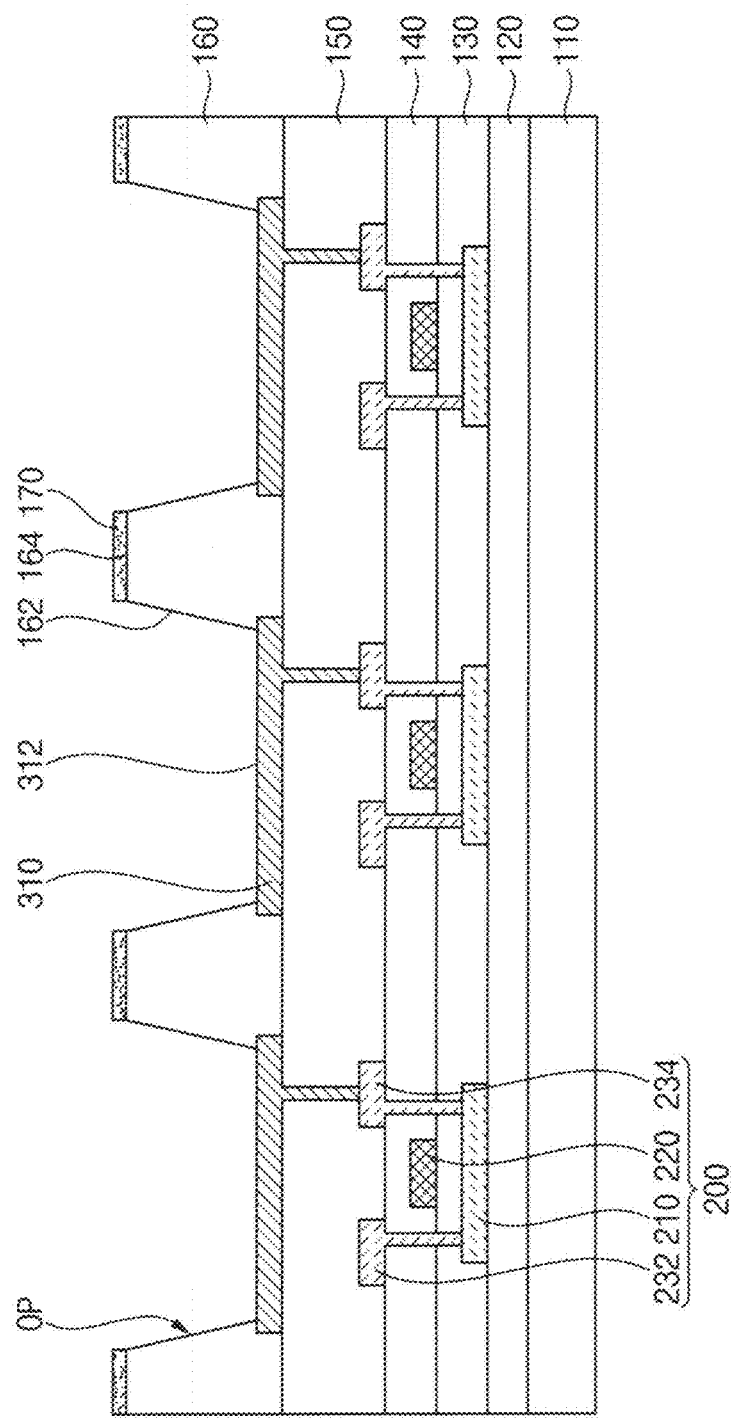

Referring to FIGS. 10 and 11, after the liquid-repellency treatment, the auxiliary solvent 400 may be removed. In an embodiment, the removal process of the auxiliary solvent may be performed in a chamber VCD capable of adjusting an internal pressure. The chamber VCD may control the internal pressure, and may remove the auxiliary solvent 400 by irradiating heat on the substrate 110 in a state where the pressure is adjusted. That is, the auxiliary solvent 400 may be removed through drying and heat-treating processes in the chamber VCD. In an embodiment, the removal process of the auxiliary solvent 400 may be performed at a pressure of about $10^{-5}$ Torr to 1 Torr, and a temperature of about 25° C. to 150° C.

As the auxiliary solvent 400 is removed, the side surface 162 of the pixel defining layer 160 and the upper surface 312 of the first electrode 310 may be exposed to the outside again. At this time, as described above, since the liquid repellent layer 170 is formed on the upper surface 164 of the pixel defining layer 160, the upper surface 164 of the pixel defining layer 160 may have the liquid repellency with respect to the organic composition. On the other hand, since the liquid repellent layer 170 is not formed on the side surface 162 of the pixel defining layer 160 and the upper surface 312 of the first electrode 310, the side surface 162 of the pixel defining layer 160 and the upper surface 312 of the first electrode 310 may have lyophilicity with respect to the organic composition.

Figure 12:
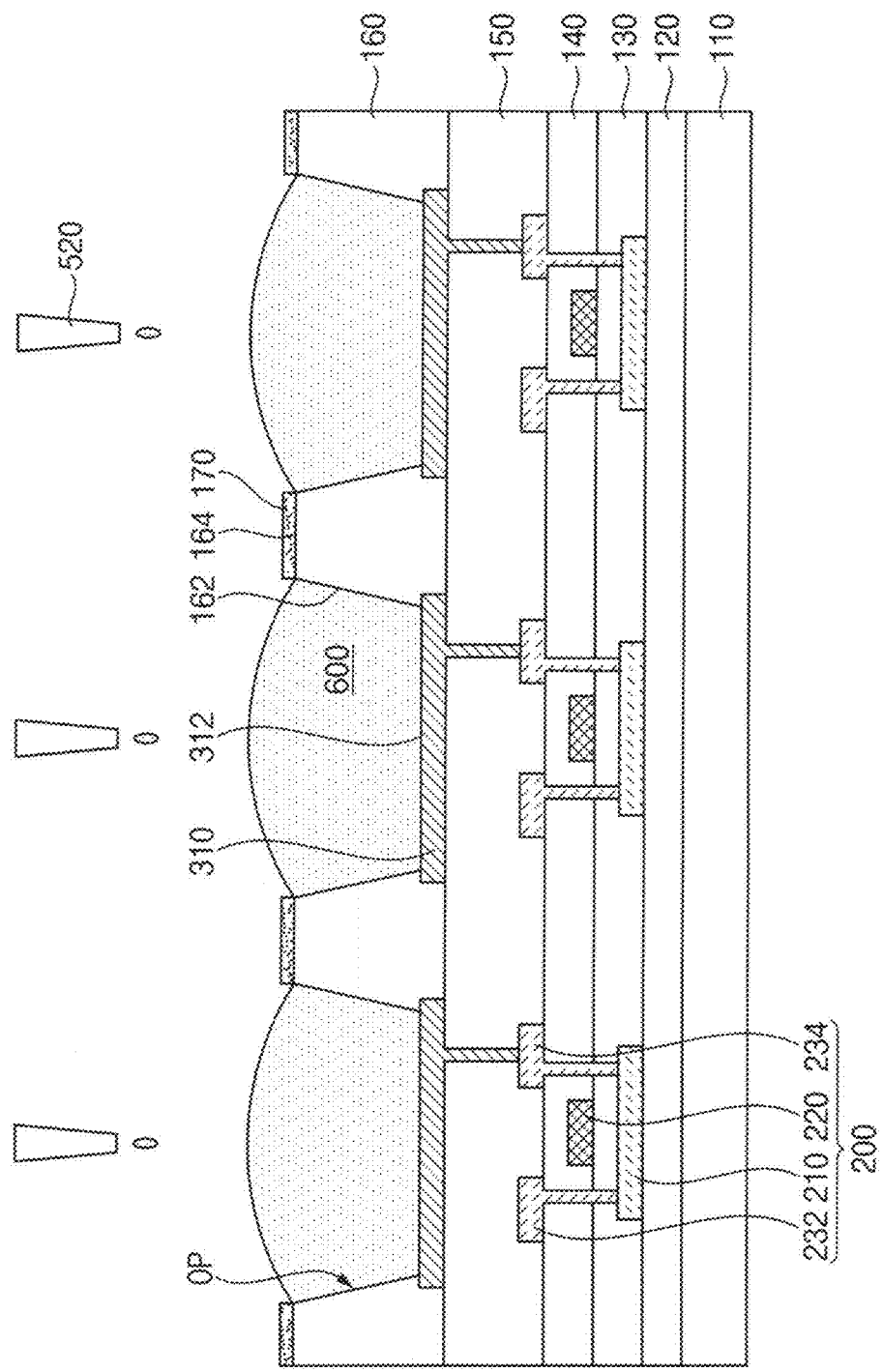

Referring to FIG. 12, the organic composition 600 may be provided into the opening OP of the pixel defining layer 160. As described above, the organic composition 600 may be a material for forming the first organic layer 320, the light emitting layer 330, or the second organic layer 340 described with reference to FIG. 3. In an embodiment, the organic composition 600 may be provided using the inkjet printing method. For example, the organic composition 600 may be provided by discharging the organic composition 600 into the opening OP through the second nozzle 520 of the inkjet printing apparatus.

In an embodiment, the organic composition 600 may include an organic solvent and a functional material. The functional material may be a material for forming the first organic layer 320, the light emitting layer 330, or the second organic layer 340 described above with reference to FIG. 3. For example, when the organic composition 600 is a material for forming the first organic layer 320, the functional material may be a hole transport material. In addition, when the organic composition 600 is a material for forming the light emitting layer 330, the functional material may be an organic light emitting material or a quantum dot material. In addition, when the organic composition 600 is a material for forming the second organic layer 340, the functional material may be an electron transport material. A method of forming the first organic layer 320 using the organic composition 600 has been illustrated and described as an example with reference to FIGS. 12 to 14, but the invention is not limited thereto, and the method described with reference to FIGS. 12 to 14 may be applied to the process of forming the light emitting layer 330 or the second organic layer 340 using the inkjet printing method, except that the functional material is different.

As described above, the organic composition 600 for forming the first organic layer 320 may include a hole transport material as the functional material. In this case, the type of the organic solvent is not limited as long as the hole transport material is dissolved therein. Examples of the organic solvent may include toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, phenyl acetate, phenyl propionic acid, methyl benzoate, ethyl benzoate, 2-ethylnaphthalene, 2-ethylbiphenyl, and the like. These may be used alone or in combination with each other.

According to embodiments, since the liquid-repellent treatment is performed in a state in which the auxiliary solvent 400 is provided in the opening OP, after the liquid-repellent treatment, the upper surface 164 of the pixel defining layer 160 may have liquid repellency with respect to the organic composition 600, and the upper surface 312 of the first electrode 310 may have lyophilicity with respect to the organic composition 600. That is, the contact angle between the organic composition 600 and the upper surface 164 of the pixel defining layer 160 may be increased by the liquid-repellent treatment, while the contact angle between the organic composition 600 and the upper surface 312 of the first electrode 310 may be kept low. For example, after the liquid-repellent treatment, the contact angle between the organic composition and the upper surface 164 of the pixel defining layer 160 may be about 55 degrees (°) or more, and the contact angle between the organic composition 600 and the upper surface 312 of the first electrode 310 may be about 5° or less.

By increasing the contact angle between the organic composition 600 and the upper surface 164 of the pixel defining layer 160, in the process of providing the organic composition 600 into the opening OP using the inkjet printing method, it is possible to minimize or prevent the overflow of the organic composition 600 to the upper surface 164 of the pixel defining layer 160. In addition, by maintaining the low contact angle between the organic composition 600 and the upper surface 312 of the first electrode 310, in the process of providing the organic composition 600 into the opening OP using the inkjet printing method, it is possible to minimize or prevent the phenomenon in which a space not filled with the organic composition 600 is generated in the opening OP.

In other words, by selectively providing liquid repellency to the upper surface of the pixel defining layer 160 by the auxiliary solvent 400 in the liquid-repellency treatment, it is possible to minimize or prevent the occurrence of a space in which the organic composition 600 is not filled in the opening OP while minimizing or preventing the overflow of the organic composition 600 to the upper surface 164 of the pixel defining layer 160. Accordingly, the yield of the display panel 1000 may be further improved.

Figure 13:
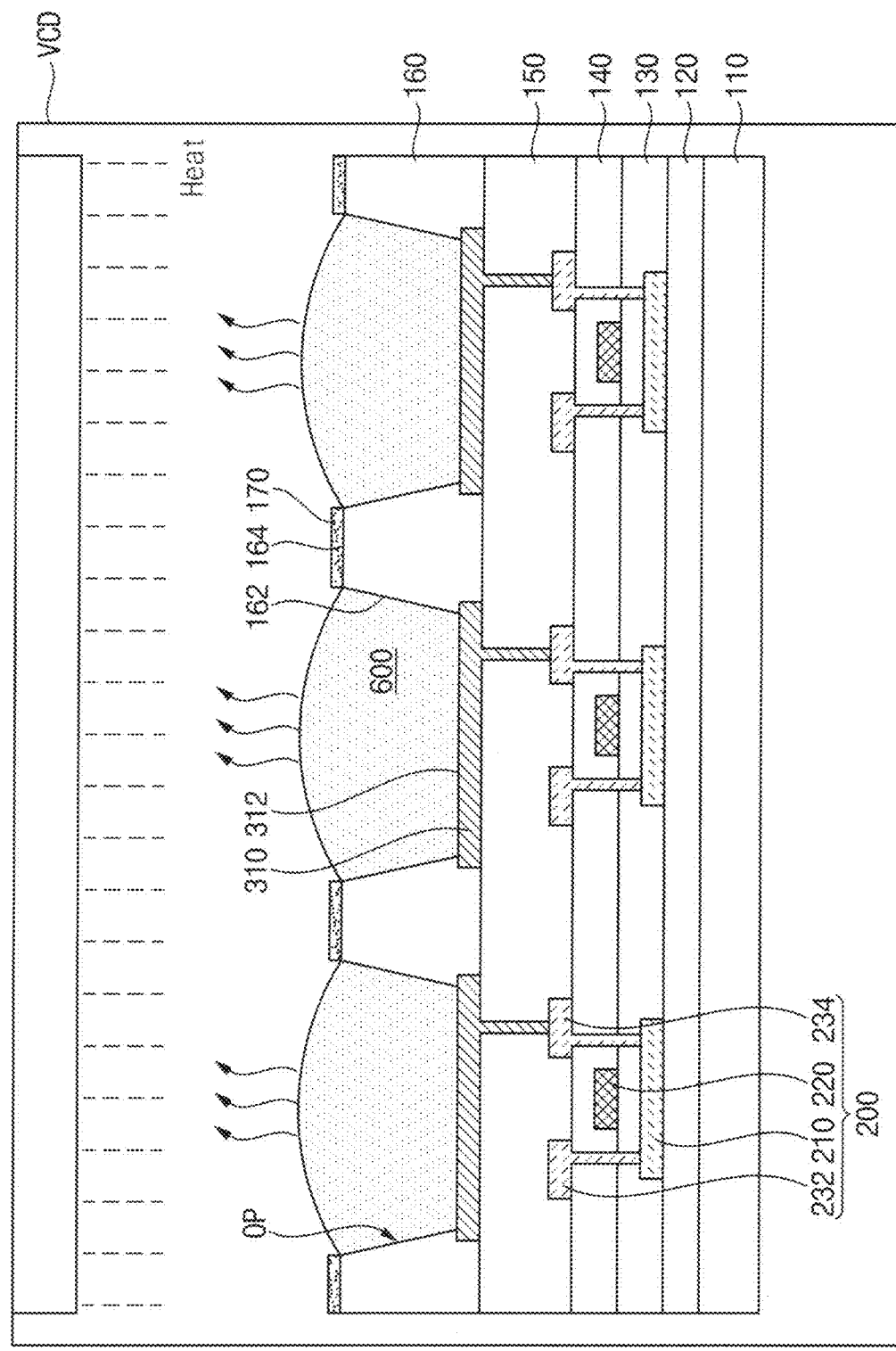
Figure 14:
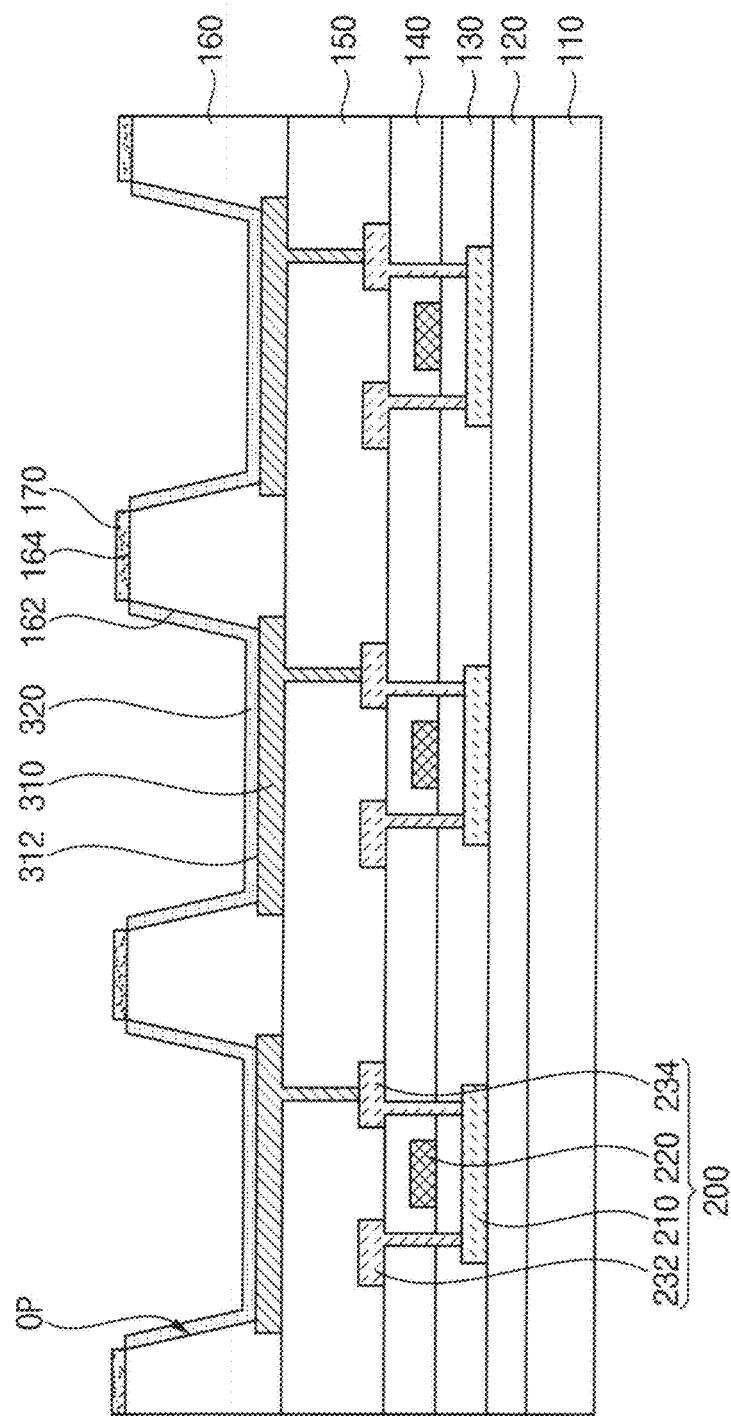

Referring to FIGS. 13 and 14, the organic composition 600 may be dried and heat-treated to form the first organic layer 320. That is, the first organic layer 320 may be formed by removing the organic solvent from the organic composition 600 through drying and heat-treating process. In an embodiment, the drying and heat-treating of the organic composition 600 may be performed in the chamber VCD capable of controlling the internal pressure. The chamber VCD may control the internal pressure, and may remove the organic solvent by irradiating heat on the substrate 110 in a state where the pressure is adjusted. That is, the organic solvent may be removed through drying and heat-treating processes in the chamber VCD.

In an embodiment, the chamber VCD in which the process of removing the organic solvent by drying and heat-treating the organic composition 600 is performed may be the same as the chamber VCD used in the removing process of the auxiliary solvent 400. For example, when the auxiliary solvent 400 and the organic solvent are substantially the same or similar, the removal process of the auxiliary solvent 400 and the removal process of the organic solvent may proceed using the same chamber VCD under the same process conditions. Accordingly, the efficiency of the manufacturing process of the display panel 1000 may be further improved, and manufacturing costs may be further reduced. For example, the organic solvent removal process may be performed at a pressure of about $10^{-5}$ Torr to about 1 Torr, and a temperature of about 25° C. to 150° C.

As the organic solvent is removed, the first organic layer 320 may be formed in the opening OP. As described above, after the process of providing the organic composition 600, the upper surface 164 of the pixel defining layer 160 may be exposed from the organic composition 600, and the upper surface 312 of the first electrode 310 may not be exposed from the organic composition 600. In this case, the upper surface 164 of the pixel defining layer 160 may be exposed from the first organic layer 320, and the upper surface 312 of the first electrode may be covered by the first organic layer 320. That is, the first organic layer 320 may not be formed on the upper surface 164 of the pixel defining layer 160, but may be formed only inside the opening OP. For example, the first organic layer 320 may be formed to contact the side surface 162 of the pixel defining layer 160 and the upper surface 312 of the first electrode 310.

Figure 15:
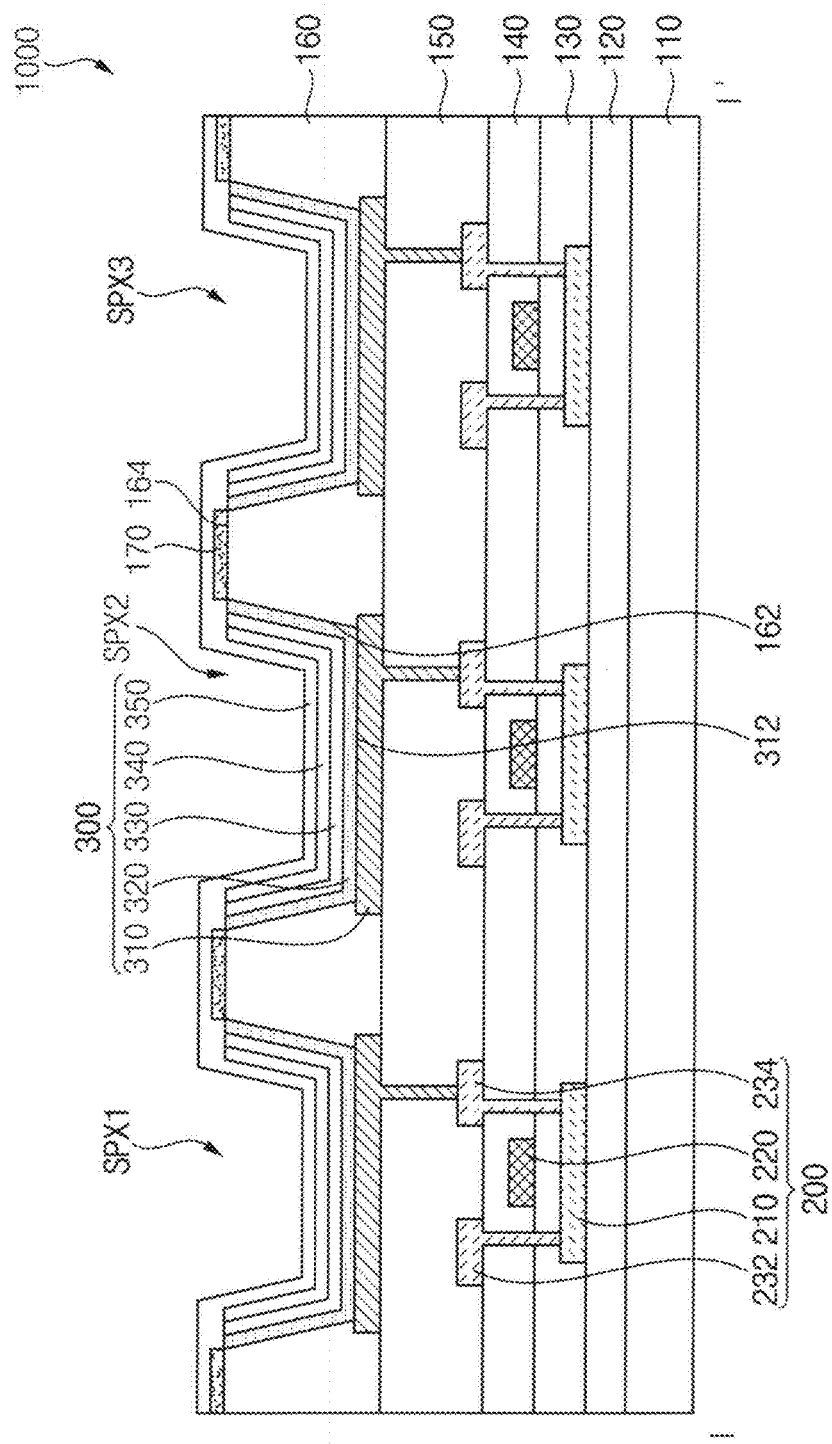

Referring to FIG. 15, the light emitting layer 330, the second organic layer 340, and the second electrode 350 may be formed on the first organic layer 320. In an embodiment, the light emitting layer 330 and the second organic layer 340 may be formed using the inkjet printing method. The first electrode 310, the first organic layer 320, the light emitting layer 330, the second organic layer 340, and the second electrode 350 may form the light emitting element 300.

According to embodiments, the method of manufacturing the display panel may include providing the auxiliary solvent 400 into the opening OP of the pixel defining layer 160 before the liquid-repellent treatment of the pixel defining layer 160. Accordingly, in the liquid-repellency treatment process, the upper surface 164 of the pixel defining layer 160 exposed from the auxiliary solvent 400 may have liquid repellency with respect to the organic composition 600. On the other hand, the upper surface 312 of the first electrode 310 covered by the auxiliary solvent 400 may have lyophilicity with respect to the organic composition 600. In other words, the upper surface 312 of the first electrode 310 may not have liquid repellency with respect to the organic composition 600. That is, by selectively providing liquid repellency to the upper surface of the pixel defining layer 160 by the auxiliary solvent 400 in the liquid repellency-treatment process, the contact angle between the organic composition 600 and the upper surface of the pixel defining layer 160 may be increased while maintaining the contact angle between the organic composition 600 and the upper surface 312 of the first electrode 310 low. Accordingly, while minimizing or preventing a phenomenon in which the organic composition 600 overflows to the upper surface 164 of the pixel defining layer 160, it is possible to minimize of prevent the occurrence of a space in which the organic composition 600 is not filled in the opening OP. Accordingly, the yield of the display panel may be further improved.

What is claimed is:

1. A method of manufacturing a display panel, the method comprising:
   forming a pixel defining layer defining an opening exposing an upper surface of a pixel electrode on a substrate on which the pixel electrode is formed;
   providing an auxiliary solvent into the opening;
   performing a liquid-repellent treatment on an upper surface of the pixel defining layer;
   removing the auxiliary solvent from the opening; and
   providing an organic composition including an organic solvent into the opening.

2. The method of claim 1, wherein the auxiliary solvent is the same as the organic solvent.

3. The method of claim 1, wherein the auxiliary solvent is discharged into the opening to cover the upper surface of the pixel electrode when providing the auxiliary solvent into the opening.

4. The method of claim 3, wherein the upper surface of the pixel defining layer is exposed from the auxiliary solvent after providing the auxiliary solvent into the opening.

5. The method of claim 4, wherein a side surface of the pixel defining layer is covered by the auxiliary solvent after providing the auxiliary solvent into the opening.

6. The method of claim 1, wherein the upper surface of the pixel defining layer has liquid repellency with respect to the organic composition after performing the liquid-repellent treatment.

7. The method of claim 6, wherein the upper surface of the pixel electrode has lyophilicity with respect to the organic composition after performing the liquid-repellent treatment.

8. The method of claim 6, wherein a first contact angle between the organic composition and the upper surface of the pixel defining layer is about 55 degrees)(° or more, and a second contact angle between the organic composition and the upper surface of the pixel electrode is about 5° or less after performing the liquid-repellent treatment.

9. The method of claim 1, a fluorine group is introduced on one surface of the pixel defining layer when performing the liquid-repellent treatment.

10. The method of claim 9, wherein a reactive gas containing a fluorine compound is used when performing the liquid-repellent treatment.

11. The method of claim 10, wherein the fluorine compound includes at least one selected from the group consisting of CF4, SiF4, C3F8, C2F6, CHF3, CCIF3, NF3, and SF6.

12. The method of claim 1, wherein the removing of the auxiliary solvent from the opening includes drying and heat-treating the auxiliary solvent.

13. The method of claim 1, further comprising:
   drying and heat-treating the organic composition to form an organic layer after providing the organic composition into the opening.

14. The method of claim 13, wherein the organic layer is in contact with a side surface of the pixel defining layer and the upper surface of the pixel electrode.

15. The method of claim 14, wherein the removing of the auxiliary solvent from the opening includes drying and heat-treating the auxiliary solvent,
   wherein drying and heat-treating the auxiliary solvent and drying and heat-treating the organic composition to form the organic layer are performed at a pressure of about $10^{-5}$ Torr to about 1 Torr and at a temperature of about 25 degrees in Celsius (° C.) to about 150° C.

16. The method of claim 1, wherein the auxiliary solvent is provided into the opening using an inkjet printing method.

17. The method of claim 1, wherein the organic composition includes at least one selected from the group consisting of a hole transport material, an organic light emitting material, a quantum dot material, and an electron transport material.

18. The method of claim 1, wherein forming the pixel defining layer includes:
   forming a preliminary pixel defining layer on the substrate; and
   forming the opening exposing the pixel electrode in the preliminary pixel defining layer.

19. The method of claim 18, wherein the preliminary pixel defining layer has lyophilicity with respect to the organic composition.

20. The method of claim 18, further comprising:
performing plasma-treatment to the pixel defining layer after forming the opening.

* * * * *

UNITED STATES PATENT AND TRADEMARK OFFICE
CERTIFICATE OF CORRECTION

| | | |
|---|---|---|
| PATENT NO. | : 12,382,787 B2 | Page 1 of 1 |
| APPLICATION NO. | : 17/984643 | |
| DATED | : August 5, 2025 | |
| INVENTOR(S) | : Jaekwon Hwang et al. | |

It is certified that error appears in the above-identified patent and that said Letters Patent is hereby corrected as shown below:

On the Title Page

Item [30] Foreign Application Priority Data insert:
-- March 10, 2022 (KR) .... 10-2022-0030080 --

Signed and Sealed this
Thirtieth Day of September, 2025

John A. Squires
*Director of the United States Patent and Trademark Office*